(12) United States Patent
Yokokawa et al.

(10) Patent No.: US 7,550,309 B2
(45) Date of Patent: Jun. 23, 2009

(54) METHOD FOR PRODUCING SEMICONDUCTOR WAFER

(75) Inventors: Isao Yokokawa, Gunma (JP); Nobuhiko Noto, Gunma (JP); Kiyoshi Mitani, Gunma (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 11/662,594

(22) PCT Filed: Sep. 16, 2005

(86) PCT No.: PCT/JP2005/017120

§ 371 (c)(1),
(2), (4) Date: Mar. 13, 2007

(87) PCT Pub. No.: WO2006/033292

PCT Pub. Date: Mar. 30, 2006

(65) Prior Publication Data

US 2008/0003785 A1 Jan. 3, 2008

(30) Foreign Application Priority Data

Sep. 24, 2004 (JP) ............................ 2004-278088

(51) Int. Cl.
*H01L 21/00* (2006.01)
(52) U.S. Cl. .............................. 438/46; 438/87; 438/93; 438/455; 438/473; 257/12; 257/19; 257/616; 257/E21.102
(58) Field of Classification Search .................. 438/46, 438/87, 93, 455, 473; 257/12, 19, 616, E21.102
See application file for complete search history.

(56) References Cited

U.S. PATENT DOCUMENTS 6,369,438 B1 4/2002 Sugiyama et al.

(Continued)

FOREIGN PATENT DOCUMENTS

JP   A 2000-243946   9/2000

(Continued)

OTHER PUBLICATIONS

T. Tezuka et al., "Fabrication of Strained Si on an Ultrathin SiGe-on-Insulator Virtual Substrate with a High-Ge Fraction", Applied Physics Letters, vol. 79, No. 12, Sep. 2001, pp. 1798-1800.

(Continued)

*Primary Examiner*—George Fourson
*Assistant Examiner*—John M Parker
(74) *Attorney, Agent, or Firm*—Oliff & Berridge PLC

(57) ABSTRACT

The present invention is a method for producing a semiconductor wafer, comprising at least steps of, epitaxially growing a $Si_{1-X}Ge_X$ layer (0<X<1) on an SOI wafer, forming a $Si_{1-Y}Ge_Y$ layer (0≦Y<X) on the epitaxially grown $Si_{1-X}Ge_X$ layer, and then enriching Ge in the epitaxially grown $Si_{1-X}Ge_X$ layer by an oxidation heat treatment so that the $Si_{1-X}Ge_X$ layer becomes an enriched SiGe layer, wherein, at least, the oxidation heat treatment is initiated from 950° C. or less under an oxidizing atmosphere, and the oxidation is performed so that the formed $Si_{1-Y}Ge_Y$ layer remains during a temperature rise to 950° C. Thereby, there can be provided a method for producing a semiconductor wafer by which the lattice relaxation of the SiGe layer in an SGOI wafer can be sufficiently performed by a heat treatment for a short time and its production cost can be reduced.

8 Claims, 2 Drawing Sheets

U.S. PATENT DOCUMENTS

| | | | |
|---|---|---|---|
| 6,991,956 B2 * | 1/2006 | Ghyselen et al. | 438/46 |
| 7,235,812 B2 * | 6/2007 | Chu et al. | 257/65 |
| 2004/0012075 A1 | 1/2004 | Bedell et al. | |
| 2006/0063291 A1 * | 3/2006 | Shin et al. | 438/49 |

FOREIGN PATENT DOCUMENTS

| | | |
|---|---|---|
| JP | A 2004-040122 | 2/2004 |
| JP | A 2004-363197 | 12/2004 |
| JP | A 2004-363198 | 12/2004 |
| JP | A 2004-363199 | 12/2004 |
| JP | A 2005-050984 | 2/2005 |

OTHER PUBLICATIONS

N. Sugiyama et al., "Experimental Evidence of Low Dislocation Density of SiGe-on-Insulator Substrates Fabricated by Oxidizing SiGe/SOI Structures", Extended Abstracts of the 2002 International Conference on Solid State Devices and Materials, 2002, pp. 146-147.

T. Tezuka et al., $61^{st}$ Workshop Information Packet in Separate Meeting for Bulk Growth in Japanese Association for Crystal Growth Cooperation, May 2004, p. 23.

* cited by examiner

METHOD FOR PRODUCING SEMICONDUCTOR WAFER

TECHNICAL FIELD

The present invention relates to a method for producing a semiconductor wafer, and particularly a method for producing a semiconductor wafer having a SiGe layer on an SOI (Silicon On Insulator) wafer.

BACKGROUND ART

In recent years, in order to meet demands for high-speed semiconductor devices, there has been proposed semiconductor devices, such as a high-speed MOSFET (Metal-Oxide-Semiconductor Field Effect Transistor) in which a Si layer that is epitaxially grown on a Si (silicon) substrate through a SiGe (Silicon Germanium) layer is used in a channel region.

In this case, because SiGe crystal has a larger lattice constant than that of Si crystal, tensile strain is being generated in the Si layer that is epitaxially grown on the SiGe layer (hereinafter, such a Si layer in which strain is being generated is called as a strained Si layer). By its strain stress, an energy band structure of the Si crystal is changed and therefore degeneracy of the energy band is dissolved and an energy band with high carrier-mobility is formed. Therefore, MOSFET, in which the strained Si layer is used as the channel region, indicates a higher-speed operating characteristic at approximately 1.3 to 8 times than that of a general MOSFET.

Because magnitude of the tensile strain to be generated in the strained Si layer becomes larger as a Ge concentration in the SiGe layer becomes higher, a Ge concentration in the SiGe layer is an important parameter. Hereinafter, the SiGe layer whose Ge composition ratio is X (0<x<1) is occasionally described as $Si_{1-X}Ge_X$ layer.

As a method for forming such a strained Si layer, there is a method for using an SOI wafer in which on a silicon support layer, an insulator layer such as a BOX (Buried OXide) layer is formed and thereon a silicon active layer (SOI layer) is formed. In the method, the SiGe layer is epitaxially grown on the SOI wafer, and then an oxide film is formed on a surface of the SiGe layer by an oxidation heat treatment so that the SiGe layer is enriched (oxidized and enriched) to have a desired Ge concentration, and thereon the Si layer is epitaxially grown to be a strained Si layer (see, for example, N. Sugiyama et al., Extended Abstracts of the 2002 International Conference on Solid State Devices and Materials, Nagoya, 2002, pp. 146-147, and T. Tezuka et al., Appl. Phys. Lett., Vol. 79, No. 12, pp. 1798-1800, 17 Sep. 2001). Moreover, there has been disclosed a method for oxidizing and enriching a wafer in which on the SOI wafer, a SiGe crystal layer is formed and further a Si crystal layer is formed (see, Japanese Patent Application (Kokai) No. 2000-243946). A wafer in which the SiGe layer is formed on the insulator film as described above is occasionally described as an SGOI (SiGe On Insulator) wafer.

In addition, there is a report that conventionally, when the SiGe layer is enriched to have a desired Ge concentration in the oxidation heat treatment, for sufficiently relaxing lattice so that the SiGe layer has a nearer intrinsic lattice constant determined by the Ge concentration, a thickness of the SiGe layer has to be 130 nm or more (see, Tezuka et al, page 23 of 61th workshop information packet in Separate Meeting for Bulk Growth in Japanese Association for Crystal Growth Cooperation, 28 May 2004).

DISCLOSURE OF THE INVENTION

An object of the present invention is to provide a method for producing a semiconductor wafer by which the lattice relaxation of the SiGe layer in an SGOI wafer can be sufficiently performed by a heat treatment for a short time and its production cost can be reduced.

To achieve the above object, the present invention provides a method for producing a semiconductor wafer, comprising at least steps of, epitaxially growing a $Si_{1-X}Ge_X$ layer (0<x<1) on an SOI wafer, forming a $Si_{1-Y}Ge_Y$ layer (0≦Y<X) on the epitaxially grown $Si_{1-X}Ge_X$ layer, and then enriching Ge in the epitaxially grown $Si_{1-X}Ge_X$ layer by an oxidation heat treatment so that the $Si_{1-X}Ge_X$ layer becomes an enriched SiGe layer, wherein, at least, the oxidation heat treatment is initiated from 950° C. or less under an oxidizing atmosphere, and the oxidation is performed so that the formed $Si_{1-Y}Ge_Y$ layer remains during a temperature rise to 950° C.

As described above, a $Si_{1-X}Ge_X$ layer is epitaxially grown on an SOI wafer, and thereon a $Si_{1-Y}Ge_Y$ layer having a thinner Ge concentration than that of the $Si_{1-X}Ge_X$ layer is formed. Then, when an oxidation heat treatment for enriching Ge in the $Si_{1-X}Ge_X$ layer is performed, if the heat treatment is initiated from 950° C. or less, slip dislocation or warpage can be prevented from being generated in the wafer. Moreover, when the oxidation is performed so that the formed $Si_{1-Y}Ge_Y$ layer remains during a temperature rise to 950° C., an interface between the $Si_{1-X}Ge_X$ layer and the $Si_{1-Y}Ge_Y$ layer exists constantly in a temperature rise process to 950° C. At the interface, slip deformation occurs even at a low temperature of 950° C. or less, and therefore, lattice relaxation occurs at a temperature of 950° C. or less in which slip deformation does not occur at an interface between the SiGe layer and an oxide film layer, and the lattice relaxation can be efficiently performed.

It is preferable that after the temperature rise to 950° C., the oxidation heat treatment is performed by, raising the temperature to 1200° C. or more under an argon or nitrogen atmosphere containing oxygen of 5% or less, thereby performing the oxidation until the remaining $Si_{1-Y}Ge_Y$ layer is made to disappear, then performing the enrichment of Ge under an oxidizing atmosphere, and then a heat treatment for relaxing lattice in the enriched SiGe layer is performed under an argon or nitrogen atmosphere.

When after the temperature rise to 950° C., the atmosphere is replaced to an argon or nitrogen atmosphere containing oxygen of 5% or less and the temperature is raised to 1200° C. or more, the oxidation can be controlled so as not to proceed beyond necessity at a temperature of approximately 1000° C. or less in which a diffusion velocity of Ge is low. If such a control is performed, it is prevented that Ge which is not to be taken in the oxide film does not diffuse, and therefore accumulates in the interface between the oxide film layer and the $Si_{1-X}Ge_X$ layer, dissolves and recystallizes under a subsequent high temperature, and lowers crystallinity. And, therewith, the oxidation can be performed until the remaining $Si_{1-Y}Ge_Y$ layer is made to disappear. Thereafter, if the enrichment, namely oxidation enrichment, of Ge is performed under an oxidizing atmosphere and then a heat treatment for relaxing lattice in the enriched SiGe layer is performed under an argon or nitrogen atmosphere, the lattice relaxation occurs in the temperature rise process, and therefore, the lattice relaxation is sufficiently performed even if the heat treatment for relaxing lattice is performed in a short time. Accordingly, the heat treatment time can be shortened and production cost can be reduced.

In the above case, it is preferable that a thickness of the $Si_{1-Y}Ge_Y$ layer is 5 nm to 50 nm.

When a thickness of the $Si_{1-Y}Ge_Y$ layer is 5 nm to 50 nm as described above, the thickness can be sufficient for performing the oxidation so that the $Si_{1-Y}Ge_Y$ layer remains during the temperature rise to 950° C. in the oxidation heat treatment. And, a film thickness uniformity of an oxide film formed by the oxidation heat treatment can be good and the thickness is in no danger of lowering the film thickness uniformity.

Moreover, it is possible that the $Si_{1-Y}Ge_Y$ layer is made of any one of single crystal, polycrystal, and amorphous material.

When the $Si_{1-Y}Ge_Y$ layer is made of any one of single crystal, polycrystal, and amorphous material, slip deformation occurs at the interface between the $Si_{1-Y}Ge_Y$ layer and the $Si_{1-X}Ge_X$ layer at a low temperature of 950° C. or less, and the lattice relaxation can be efficiently performed.

Moreover, it is preferable that a thickness of the $Si_{1-X}Ge_X$ layer is less than 130 nm.

Conventionally, it is supposed that for sufficiently performing the lattice relaxation, the thickness of the SiGe layer is required to be 130 nm or more. However, according to the present invention, even at a low temperature of 950 or less, slip deformation occurs at the interface between the $Si_{1-Y}Ge_Y$ layer and the $Si_{1-X}Ge_X$ layer, and the lattice relaxation can be efficiently performed. Therefore, even when a thickness of the $Si_{1-X}Ge_X$ layer is less than 130 nm, the lattice relaxation can be sufficiently performed.

Moreover, it is preferable that the Y is 0.

When the Y is 0, namely, the $Si_{1-Y}Ge_Y$ layer is a Si layer as described above, the Ge can be more certainly prevented from accumulating in the interface between the SiGe layer and the oxide film layer, and crystallinity can be prevented from being lowered.

Moreover, it is preferable that the X is less than 0.2.

When the X is less than 0.2, namely, a Ge concentration is less than 20%, the $Si_{1-X}Ge_X$ layer comes to be capable of having sufficiently little misfit dislocation to be generated at a crystalline interface between the $Si_{1-X}Ge_X$ layer and the SOI layer or the like along with the lattice relaxation.

Moreover, it is preferable that before the oxidation heat treatment, at least one kind of hydrogen ion, rare gas ion, ion of group 4 element, and oxygen ion is implanted into an interface between an SOI layer and a BOX layer in the SOI wafer.

When at least one kind of hydrogen ion, rare gas ion, ion of group 4 element, and oxygen ion is implanted into an interface between the SOI layer and the BOX layer as described above, the lattice relaxation in the SiGe layer by the subsequent oxidation heat treatment can be promoted and a lattice relaxation rate can be more improved.

According to the present invention, when a $Si_{1-X}Ge_X$ layer is epitaxially grown on an SOI wafer and thereon a $Si_{1-Y}Ge_Y$ layer having a thinner Ge concentration than that of the $Si_{1-X}Ge_X$ layer and then an oxidation heat treatment for enriching Ge in the $Si_{1-X}Ge_X$ layer, if the heat treatment is initiated from 950° C. or less, slip dislocation or warpage can be prevented from being generated in the wafer. Moreover, when the oxidation is performed so that the $Si_{1-Y}Ge_Y$ layer remains during a temperature rise to 950° C., an interface between the $Si_{1-X}Ge_X$ layer and the $Si_{1-Y}Ge_Y$ layer exists constantly in a temperature rise process to 950° C., and at the interface, slip deformation occurs. Therefore, lattice relaxation occurs even at a low temperature of 950° C. or less in which slip deformation does not occur at an interface between the SiGe layer and an oxide film layer, and the lattice relaxation can be efficiently performed. Thereby, a time of the subsequent heat treatment for relaxing lattice can be shortened and the production cost can be reduced.

Moreover, when after the temperature rise to 950° C., the atmosphere is replaced to an argon or nitrogen atmosphere containing oxygen of 5% or less and the temperature is raised to 1200° C. or more, the oxidation can be controlled so as not to proceed beyond necessity at a temperature of approximately 1000° C. or less in which a diffusion velocity of Ge is low. If such a control is performed, it is prevented that Ge which is not to be taken in the oxide film does not diffuse, and therefore accumulates in the interface between the oxide film layer and the $Si_{1-X}Ge_X$ layer, dissolves and recrystallizes under a subsequent high temperature, and lowers crystallinity. And, therewith, the oxidation can be performed until the remaining $Si_{1-Y}Ge_Y$ layer is made to disappear. Thereafter, if the oxidation enrichment of Ge is performed under an oxidizing atmosphere and then a heat treatment for relaxing lattice in the enriched SiGe layer is performed under an argon or nitrogen atmosphere, the lattice relaxation occurs in the temperature rise process, and therefore, the lattice relaxation is sufficiently performed even if the heat treatment for relaxing lattice is performed at a short time. Accordingly, the heat treatment time can be shortened and the production cost can be reduced.

BEST MODE FOR CARRYING OUT THE INVENTION

Figure 1:
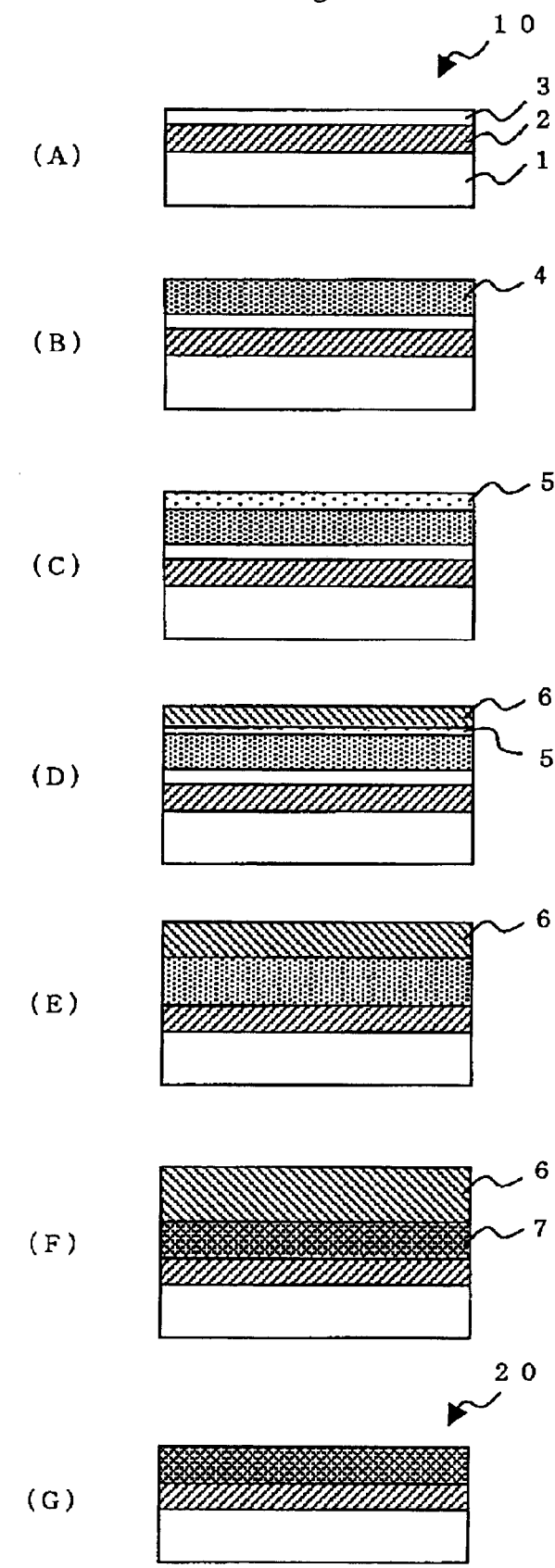
FIG. 1 is a process chart showing an example of the process of producing a semiconductor wafer according to an embodiment of the present invention.

Hereinafter, the present invention will be explained in detail.

In an SGOI wafer in which a SiGe layer is epitaxially grown on a Si layer of an SOI wafer or the like, the SiGe layer has strain corresponding to the difference between the SiGe layer and the Si layer in lattice constant. Therefore, for providing sufficient strain in a strained Si layer to be formed thereon, it is necessary to sufficiently perform the lattice relaxation so that the lattice constant of the SiGe layer is approximated to an intrinsic lattice constant determined by a Ge concentration. However, conventionally, for performing sufficient lattice relaxation, it has been necessary that a thickness of the SiGe layer is made to be thicker, or that the heat treatment for relaxing lattice is performed for a long time, or the like. Therefore, the production time has become long and the production cost has been caused to increase.

The present inventors have thoroughly investigated in order to solve these problems, to shorten the production time, and to reduce the production cost. As a result, the present inventors has found that in the case in which a Si layer is formed on the SiGe layer, a lattice relaxation rate after the oxidation enrichment to be performed at 1200° C. or more becomes higher than that of the case in which an oxide film layer is formed on the SiGe layer. Here, the lattice relaxation rate is an amount that relatively represents the extent of the lattice relaxation, in which the rate is 0% when the lattice constant of the SiGe layer is equal to that of Si and the rate is 100% when the lattice constant of the SiGe layer is an intrinsic lattice constant determined by a Ge concentration. As a result of testing its reason, it has been found that the difference of the lattice relaxation rates is caused because slip deformation at an interface of the SiGe layer is required for the lattice relaxation and, at a low temperature of 1000° C. or less, slip deformation occurs at an interface between the Si layer and the SiGe layer and on the other hand slip deformation at an interface between the oxide film layer and the SiGe layer is difficult to occur. Moreover, it has been found that when a SiGe layer having a low Ge concentration is used instead of the Si layer, such slip deformation at the interface occurs at the low temperature of 1000° C. or less.

Then, it has been found that when a $Si_{1-X}Ge_X$ layer is epitaxially grown on an SOI wafer and thereon a $Si_{1-Y}Ge_Y$ layer (including a Si layer: Y=0) having a thinner Ge concentration than that of the $Si_{1-X}Ge_X$ layer and thereafter in performing an oxidation heat treatment for enriching Ge in the $Si_{1-X}Ge_X$ layer, if the oxidation is performed so that the $Si_{1-Y}Ge_Y$ layer remains during a temperature rise to 950° C., an interface between the $Si_{1-X}Ge_X$ layer and the $Si_{1-Y}Ge_Y$ layer exists constantly in a temperature rise process to 950° C. and slip deformation occurs at the interface, and therefore, the lattice relaxation occurs even at a low temperature of 1000° C. or less in which slip deformation does not occur at an interface between the SiGe layer and an oxide film layer, and the lattice relaxation can be efficiently performed. Then, the present invention has been accomplished.

Hereinafter, embodiments according to the present invention will be explained with reference to drawings. However, the present invention is not limited thereto.

FIG. 1 is a process chart showing an example of the process of producing a semiconductor wafer according to an embodiment of the present invention.

First, as shown in FIG. 1(A), an SOI wafer 10 is prepared. The SOI wafer 10 is produced by superposing a silicon support layer 1, a BOX layer 2, and an SOI layer 3, in order. Its characteristic is not particularly limited. Moreover, either of the SOI wafers produced by, for example, a SIMOX (Separation by IMplanted OXygen) method or a bonding method can be used.

Next, as shown in FIG. 1(B), a $Si_{1-X}Ge_X$ layer 4 is epitaxially grown on the SOI layer 3 at a desired thickness. The X complies with 0<x<1, and, for example, X=0.15 is possible. Moreover, the thickness is not particularly limited. However, less than 130 nm is preferable, and, for example, the thickness of 70 nm is possible. Conventionally, it is supposed that if the thickness of the $Si_{1-X}Ge_X$ layer 4 is not 130 nm or more, lattice relaxation cannot be sufficiently performed at a subsequent oxidation heat treatment. However, in the present invention, the lattice relaxation can be sufficiently performed even when a thickness of the $Si_{1-X}Ge_X$ layer is less than 130 nm as described above. Because the thickness can be thin as described above, a time of the epitaxial growth can be shortened. In addition, X<0.2 is preferable because misfit dislocation along with the lattice relaxation can be sufficiently suppressed.

The epitaxial growth can be performed by a CVD (Chemical Vapor Deposition) method or a MBE (Molecular Beam Epitaxy) method or the like. In the case of the CVD method, for example, as a material gas, a mixed gas of $SiH_4$ or $SiH_2Cl_2$ and $GeH_4$ can be used. As a carrier gas, $H_2$ is used. As a growth condition, for example, the temperature may be 600-1000° C. and the pressure may be 100 Torr ($1.33 \times 10^4$ Pa) or less.

Next, as shown in FIG. 1 (C), a $Si_{1-Y}Ge_Y$ layer 5 is formed on the $Si_{1-X}Ge_X$ layer 4 at a desired thickness. The Y complies with 0≦y<X. It is sufficient that the Y is smaller than the X. However, Y=0 is preferable. When the Y is set to 0, namely, the $Si_{1-Y}Ge_Y$ layer is a Si layer, Ge can be more certainly prevented from accumulating in the interface between the $Si_{1-X}Ge_X$ layer and the oxide film layer and its crystallinity can be prevented from being lowered, in a temperature rise process in the oxidation heat treatment to be described later. Moreover, the thickness is not particularly limited. However, 5 nm to 50 nm is preferable, for example, 10 nm is possible. If the thickness of $Si_{1-Y}Ge_Y$ layer is 5 nm to 50 nm, the thickness can be sufficient for performing the oxidation so that the $Si_{1-Y}Ge_Y$ layer remains during a temperature rise to 950° C. in the oxidation heat treatment to be described later. And, the thickness can be good in film thickness uniformity of the oxide film to be formed by the oxidation heat treatment.

Moreover, in this case, it is preferable that the $Si_{1-Y}Ge_Y$ layer 5 is made of any one of single crystal, polycrystal, and amorphous material because slip deformation occurs at the interface between the $Si_{1-Y}Ge_Y$ layer 5 and the $Si_{1-X}Ge_X$ layer 4 even at a low temperature of 950° C. or less and the lattice relaxation of the $Si_{1-X}Ge_X$ layer 4 can be efficiently performed in the temperature rise process in the oxidation heat treatment to be described later. In this case, for example, when the $Si_{1-Y}Ge_Y$ layer 5 is single crystal, it can be formed by epitaxial growth in the same manner as described above.

In addition, after the formation of the $Si_{1-Y}Ge_Y$ layer 5, a surface of the $Si_{1-Y}Ge_Y$ layer 5 may be subjected to a RCA cleaning, which is a standard cleaning method. As a Ge concentration in a SiGe layer is higher, an etching rate is higher with respect to the RCA cleaning, and surface roughness is more easily caused than that of a Si layer. However, because the Ge concentration of the $Si_{1-Y}Ge_Y$ layer 5 is smaller than that of the $Si_{1-X}Ge_X$ layer 4, influence of the surface roughness can be suppressed, compared to the case in which a surface of the $Si_{1-X}Ge_X$ layer 4 is directly cleaned. In particular, it is preferable that the $Si_{1-Y}Ge_Y$ layer 5 is a Si layer because the surface roughness is not caused.

Furthermore, for effectively performing the lattice relaxation by the oxidation heat treatment, it is preferable that at least one kind of hydrogen ion, rare gas ion (He ion, Ne ion, or Ar ion), ion of group 4 element (C ion, Si ion, Ge ion), and oxygen ion is implanted into an interface between the BOX layer 2 and the SOI layer 3 in the SOI wafer before the oxidation heat treatment. In this case, an amount of the implanted ion can be $1\times10^{15}$-$4\times10^{16}$/cm². If the implanted amount is $1\times10^{15}$/cm² or less, it is difficult to desire the improvement effect of the lattice relaxation rate, and if the implanted amount is $4\times10^{16}$/cm² or more, the ion implanted layer is in a danger of being delaminated by the oxidation heat treatment.

Moreover, the timing of performing the above-described ion implantation is not particularly limited as long as performing before the oxidation heat treatment. It can be performed at any time before the growth of the $Si_{1-X}Ge_X$ layer 4 (FIG. 1 (A)), after the growth of the $Si_{1-X}Ge_X$ layer 4 (FIG. 1 (B)), and after the growth of the $Si_{1-Y}Ge_Y$ layer 5 (FIG. 1 (C)). However, it is preferable to perform the ion implantation after the growth of the $Si_{1-Y}Ge_Y$ layer 5 because damage can be caused on its surface by the ion implantation and the damage can cause abnormal growth or the like in a subsequent layer growth.

Next, as shown in FIGS. 1 (D)-(F), an oxide film layer 6 is formed by the oxidation heat treatment, and Ge in the $Si_{1-X}Ge_X$ layer 4 is enriched so that the $Si_{1-X}Ge_X$ layer 4 becomes an enriched SiGe layer 7. The oxidation heat treatment can be performed by such a process as shown in FIG. 2.

Figure 2:
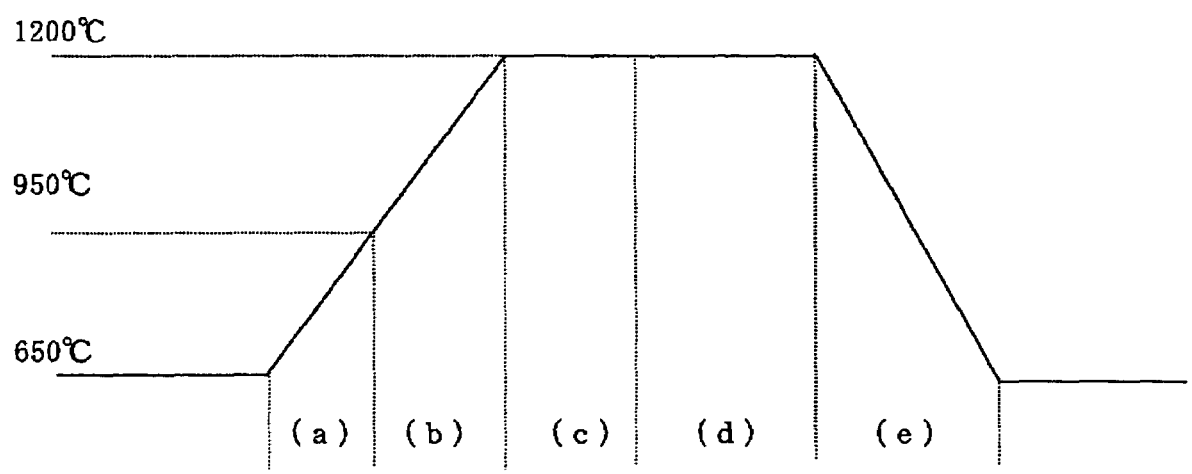
FIG. 2 is a process chart showing an example of the process of an oxidation heat treatment according to an embodiment of the present invention.

FIG. 2 is a process chart showing an example of temperature of each step in the process of an oxidation heat treatment according to an embodiment of the present invention. The (a)-(e) represent each steps and the solid line represents temperature.

In the oxidation heat treatment, first, an oxide film is formed on a surface of the $Si_{1-Y}Ge_Y$ layer 5 so that the Ge does not out-diffuse from the surface during the heat treatment. In this case, as shown in Step (a), the oxidation heat treatment is initiated under an oxidizing atmosphere from a temperature of 950° C. or less, such as 650-700° C. During a temperature rise to 950° C., the oxidation is performed so that the $Si_{1-Y}Ge_Y$ layer 5 remains (FIG. 1 (D)). Thereby, on the surface of the $Si_{1-Y}Ge_Y$ layer 5, an oxide film layer 6 being capable of preventing Ge from out-diffusing is formed. In this case, it is possible that, for example, a 100% dry oxygen is introduced in a heat treatment furnace at a flow rate of 10 SLM, and the temperature is raised at a rate of 10° C./min. The rate of the temperature rise can be adjusted according to a thickness of the $Si_{1-Y}Ge_Y$ layer 5 and so forth.

For a large-diameter wafer such as having a diameter of 300 mm or more, it is suitable that in performing the oxidation heat treatment, the heat treatment is initiated from 950° C. or less because slip dislocation or warpage can be prevented from being generated in the wafer. Moreover, when the oxidation is performed so that the $Si_{1-Y}Ge_Y$ layer 5 remains during the temperature rise to 950° C., an interface between the $Si_{1-X}Ge_X$ layer 4 and the $Si_{1-Y}Ge_Y$ layer 5 exists constantly, and slip deformation occurs in the interface. Furthermore, slip deformation also occurs at an interface between the SOI layer 3 and the $Si_{1-X}Ge_X$ layer 4. On the other hand, a higher temperature than 950° C. is required in order that slip deformation due to viscous flow of the oxide film is made to occur at the interface between the SiGe layer and the oxide film layer. Therefore, in the present invention, even at a low temperature of 950° C. or less, the lattice relaxation in the $Si_{1-X}Ge_X$ layer 4 occurs by slip deformation occurring at the interface between the $Si_{1-X}Ge_X$ layer 4 and the $Si_{1-Y}Ge_Y$ layer 5, and the lattice relaxation can be efficiently performed.

After the temperature is raised to 950° C. as described above, as shown in Step (b) in FIG. 2, the temperature is raised to 1200° C. or more under an argon or nitrogen atmosphere containing oxygen of 5% or less so that the oxidation is performed until the remaining $Si_{1-Y}Ge_Y$ layer 5 is made to disappear (FIG. 1 (E)). In this step, it is possible that, for example, the argon and the oxygen are introduced in the heat treatment furnace at flow rates of 25 SLM (Standard Litter per Minute) and 0.5 SLM respectively, and thereby the atmosphere is replaced and the temperature is raised to 1200° C. at a rate of 10° C./min. The rate of the temperature rise can be adjusted according to thickness of the $Si_{1-Y}Ge_Y$ layer 5 and so forth. Moreover, instead of the argon, the nitrogen may be used.

When after the temperature rise to 950° C., the atmosphere is replaced to an argon or nitrogen atmosphere containing oxygen of 5% or less and the temperature is raised to 1200° C. or more, the oxidation can be controlled so as not to proceed beyond necessity at a temperature of 1000° C. or less in which a diffusion velocity of Ge is low. Because the Ge is not taken in an oxide film, if a growth rate of the oxide film is higher than a diffusion velocity of the Ge, the Ge does not diffuse, and the Ge comes to be accumulated in the interface between the oxide film and the SiGe layer. That is, a layer having a extremely high concentration of Ge is formed in the vicinity of the interface, and therefore, if the oxidation temperature is made to be a high temperature of 1200° C. or more in a state that such a high-Ge-concentration layer is formed, the high-Ge-concentration layer is in danger of dissolving and recrystallizing and thereby crystallinity of the $Si_{1-X}Ge_X$ layer 4 may become extremely low. However, according to the present invention, such danger can be made to disappear by the replacement of the atmosphere at a temperature of approximately 950° C. In addition, if the atmosphere is 100% argon or nitrogen, the oxide film layer 6 in the surface is in danger of being etched. Therefore, the atmosphere is set to contain oxygen of 5% or less.

In the temperature rise process, the $Si_{1-Y}Ge_Y$ layer 5 is oxidized to disappear, and the Ge contained therein diffuses in the $Si_{1-X}Ge_X$ layer 4. Moreover, Ge diffuses in the SOI layer 3, the SOI layer 3 is integrated into the $Si_{1-X}Ge_X$ layer 4.

Next, as shown in Step (C) in FIG. 2, the temperature is held to 1200° C. or more after the temperature rise and the atmosphere is replaced to an oxidizing atmosphere. The oxidation heat treatment is performed and the oxide film layer 6 is thickened. Thereby, an oxidation enrichment of Ge is performed so that the Ge concentration becomes a desired concentration. The step can be performed by, for example, introducing a 100% dry oxygen in the heat treatment furnace at a flow rate of 10 SLM, thereby replacing the atmosphere, and then performing the oxidation heat treatment at 1200° C. for 20-120 min. The heat treatment temperature or the heat treatment time can be adjusted according to, the thickness of the $Si_{1-X}Ge_X$ layer 4, the Ge concentration, and so forth. Moreover, because the step is performed at a high temperature, the diffusion velocity of the Ge becomes sufficiently high. Therefore, even if the growth rate of the oxide film is not particularly controlled, accumulation of the Ge does not occur. In this way, the Ge in the $Si_{1-X}Ge_X$ layer 4 is enriched, so that the $Si_{1-X}Ge_X$ layer 4 becomes an enriched SiGe layer 7 having a desired Ge concentration (FIG. 1(F)).

Next, as shown in Step (d) in FIG. 2, a heat treatment for relaxing lattice of the enriched SiGe layer 7 is performed under an argon or nitrogen atmosphere. The step can be performed by, for example, introducing argon in the heat treatment furnace at a flow rate of 10 SLM, thereby replacing the atmosphere, and then performing the heat treatment at 1200° C. for 120-240 min. The heat treatment temperature or the heat treatment time can be adjusted according to, the thickness of the enriched SiGe layer 7, the Ge concentration, and so forth. The lattice relaxation occurs mainly due to slip deformation at the interface between the oxide film layer 6 and the enriched SiGe layer 7 (viscous flow of the oxide film). In the present invention, also in the temperature rise process, the lattice relaxation is made to occur by utilizing slip deformation at the interfaces between the $Si_{1-X}Ge_X$ layer 4 and the $Si_{1-Y}Ge_Y$ layer 5 and between the $Si_{1-X}Ge_X$ layer 4 and the SOI layer 3. Therefore, by the heat treatment for relaxing lattice, it becomes possible that the lattice relaxation is sufficiently performed even in a short time. When the lattice relaxation is not made to occur in the temperature rise process, a heat treatment for an extremely long time is required for sufficiently performing the lattice relaxation only by the heat treatment for relaxing lattice in Step (d).

After the lattice relaxation is sufficiently performed by the heat treatment for relaxing lattice, as shown in Step (e) in FIG. 2, the temperature is lowered, for example, under an argon or nitrogen atmosphere at a rate of 5° C./min, and when the temperature becomes approximately 650-700° C., the wafer is taken out of the heat treatment furnace.

Last, as shown in FIG. 1(G), the oxide film layer 6 formed on the surface is removed, and thereby an SGOI wafer 20 can be obtained. The removal of the oxide film layer 6 can be performed by, for example, immersing the wafer in a 15% HF aqueous solution. The SGOI wafer produced as described above has a SiGe layer being thinner than that of a conventional one, and the SiGe layer is sufficiently lattice-relaxed in the heat treatment for a short time, and has a high lattice relaxation rate. And, the SGOI wafer becomes an SGOI wafer of high quality and low cost. In addition, the lattice relaxation rate can be evaluated by using an X-ray diffraction method.

Hereinafter, the present invention will be specifically explained with reference to Examples of the present invention and Comparative examples. However, the present invention is not limited thereto.

EXAMPLE 1

On a surface of an SOI wafer of a diameter of 300 mm having a BOX layer of a thickness of 150 nm and an SOI layer of a thickness of 50 nm that is produced by a SIMOX method, a $Si_{0.85}Ge_{0.15}$ layer (that is, X=0.15) of a thickness of 70 nm and a Si layer (that is, Y=0) of a thickness of 10 nm were epitaxially grown in order by a CVD method with using $SiH_4$ and $GeH_4$ as material gasses at a growth temperature of 650° C. Next, the wafer was put in a heat treatment furnace at 700° C., and an oxidation heat treatment was initiated. First, the temperature was raised from 700° C. to 1000° C. under a dry oxygen atmosphere at a rate of 10° C./min. According to a test performed separately in the same condition, when the temperature reached 950° C., a thickness of an oxide film formed on the surface was measured and was 15 nm. Therefore, it is thought that the Si layer on the surface was oxidized only by approximately 7 nm and that approximately 3 nm remained as the Si layer.

Next, therefore, the heat treatment atmosphere was replaced to an argon atmosphere containing 1% oxygen, and the temperature was raised from 1000° C. to 1200° C. at a rate of 10° C./min. According to a test performed separately in the same condition, when the temperature reached 1200° C., a thickness of an oxide film formed on the surface was 35 nm. Therefore, it is thought that the Si layer on the surface was completely oxidized and that some $Si_{0.85}Ge_{0.15}$ layer was also oxidized.

When the temperature was raised to 1200° C., the atmosphere was replaced to a 100% dry oxygen, and an oxidation enrichment for 40 min was performed with holding the temperature to 1200° C., and thereby an enriched SiGe layer was formed. Thereby, the total thickness of the formed oxide film became approximately 180 nm.

Next, the atmosphere was replaced to a 100% argon atmosphere, and a heat treatment for relaxing lattice for 240 min was performed with holding the temperature to 1200° C. Then, the temperature was lowered at a rate of 5° C./min. When the temperature became 700° C., the wafer was taken out of the heat treatment furnace and the oxide film on the surface was removed by immersing the wafer in a 15% HF aqueous solution, and thereby an SGOI wafer was obtained.

The SGOI wafer obtained in this manner had the enriched SiGe layer of a thickness of 50 nm and a 20% Ge concentration. Moreover, when a lattice relaxation rate was evaluated by an X-ray diffraction method, the lattice relaxation rate was 60%. Therefore, the lattice relaxation could be sufficiently performed although the thickness of the SiGe layer before the oxidation heat treatment was thin, which was 70 nm.

COMPARATIVE EXAMPLE 1

An SGOI wafer was obtained in the same production condition as Example 1 except that a Si layer was not epitaxially grown on the $Si_{0.85}Ge_{0.15}$ layer. However, when the lattice relaxation rate was evaluated by the X-ray diffraction method, the lattice relaxation rate was 30% and was lower than that of Example 1 and insufficient.

EXAMPLE 2

By using an SOI wafer specified in the same manner as Example 1, the growth of the $Si_{0.85}Ge_{0.15}$ layer and the Si layer was performed in the same condition as Example 1. Then, $H^+$ ions were implanted at an implantation amount of $3 \times 10^{16}/cm^2$ with aiming at the vicinity of an interface between the SOI layer and the BOX layer. Furthermore, the oxidation heat treatment and the removal of the oxide film were performed, and thereby, an SGOI wafer having an enriched SiGe layer of a thickness of 50 nm and a 20% Ge concentration was obtained. When a lattice relaxation rate of the enriched SiGe layer was evaluated by the X-ray diffraction method, the lattice relaxation rate was 70%. Therefore, it was confirmed that the lattice relaxation rate was more improved than that of the SGOI wafer of Example 1, which was not implanted with hydrogen ions.

COMPARATIVE EXAMPLE 2

An SGOI wafer was obtained in the same production condition as Example 2 except that a Si layer was not epitaxially grown on the $Si_{0.85}Ge_{0.15}$ layer. However, when a lattice relaxation rate was evaluated by the X-ray diffraction method, the lattice relaxation rate was 43%, which was more improved than that of Comparative example 1. However, the lattice relaxation rate was significantly lower than those of Example 1 and Example 2, and was insufficient.

The present invention is not limited to the above-described embodiments. The above-described embodiments are mere examples, and those having the substantially same constitution as that described in the appended claims and providing the similar action and advantages are included in the scope of the present invention.

The invention claimed is:

1. A method for producing a semiconductor wafer, comprising at least steps of:
    (1) epitaxially growing a $Si_{1-X}Ge_X$ layer (0<X<1) on an SOI wafer;
    (2) forming a $Si_{1-Y}Ge_Y$ layer (0≦Y<X) on the epitaxially grown $Si_{1-X}Ge_X$ layer;
    (3) and then enriching Ge in the epitaxially grown $Si_{1-X}Ge_X$ layer by an oxidation heat treatment so that the $Si_{1-X}Ge_X$ layer becomes an enriched SiGe layer; and
    (4) performing a heat treatment for relaxing the lattice in the enriched SiGe layer under an argon or nitrogen atmosphere;
    wherein, at least, the oxidation heat treatment is
        (3a) initiated from 950° C. or less under an oxidizing atmosphere, and the oxidation is performed so that the formed $Si_{1-Y}Ge_Y$ layer remains during a temperature rise to 950° C.; and then after the temperature rise to 950° C.
        (3b) performed by raising the temperature to 1200° C. or more under an argon or nitrogen atmosphere containing oxygen of 5% or less, thereby performing the oxidation until the remaining $Si_{1-Y}Ge_Y$ layer is made to disappear; and then,
        (3c) performed by performing oxidation under an oxidizing atmosphere to perform the enrichment of Ge.

2. The method for producing a semiconductor wafer according to claim 1, wherein a thickness of the $Si_{1-Y}Ge_Y$ layer is 5 nm to 50 nm.

3. The method for producing a semiconductor wafer according to claim 1, wherein the $Si_{1-Y}Ge_Y$ layer is made of any one of single crystal, polycrystal, and amorphous material.

4. The method for producing a semiconductor wafer according to claim 2, wherein the $Si_{1-Y}Ge_Y$ layer is made of any one of single crystal, polycrystal, and amorphous material.

5. The method for producing a semiconductor wafer according to claim 1, wherein a thickness of the $Si_{1-X}Ge_X$ layer is less than 130 nm.

6. The method for producing a semiconductor wafer according to claim 1, wherein the Y is 0.

7. The method for producing a semiconductor wafer according to claim 1, wherein the X is less than 0.2.

8. The method for producing a semiconductor wafer according to claim 1, wherein before the oxidation heat treatment, at least one kind of hydrogen ion, rare gas ion, ion of group 4 element, and oxygen ion is implanted into an interface between an SOI layer and a BOX layer in the SOI wafer.

* * * * *